(12) United States Patent
Lin et al.

(10) Patent No.: US 10,385,176 B2
(45) Date of Patent: Aug. 20, 2019

(54) TRANSPARENT POLYIMIDE COMPOSITE FILM FOR FLEXIBLE DISPLAY AND METHOD FOR MANUFACTURING THE SAME

(71) Applicant: TAIMIDE TECH. INC., Hsinchu (TW)

(72) Inventors: Chih-Wei Lin, Hsinchu (TW); Chun-Ting Lai, Hsinchu (TW)

(73) Assignee: TAIMIDE TECH. INC., Hsinchu (TW)

( * ) Notice: Subject to any disclaimer, the term of this patent is extended or adjusted under 35 U.S.C. 154(b) by 128 days.

(21) Appl. No.: 15/729,837

(22) Filed: Oct. 11, 2017

(65) Prior Publication Data

US 2019/0106547 A1   Apr. 11, 2019

(51) Int. Cl.
| | |
|---|---|
| *C08J 5/18* | (2006.01) |
| *H01L 27/32* | (2006.01) |
| *H01L 51/52* | (2006.01) |
| *B29C 35/02* | (2006.01) |
| *H05K 1/03* | (2006.01) |
| *H01L 51/00* | (2006.01) |

(52) U.S. Cl.
CPC ............... *C08J 5/18* (2013.01); *B29C 35/02* (2013.01); *H01L 27/32* (2013.01); *H01L 51/5253* (2013.01); *H05K 1/0353* (2013.01); *H05K 1/0393* (2013.01); *H01L 51/0097* (2013.01); *H01L 2227/326* (2013.01); *H01L 2251/5338* (2013.01); *H05K 2201/10128* (2013.01); *H05K 2203/0156* (2013.01); *H05K 2203/0191* (2013.01); *H05K 2203/0264* (2013.01)

(58) Field of Classification Search
CPC combination set(s) only.
See application file for complete search history.

(56) References Cited

U.S. PATENT DOCUMENTS

2006/0084193 A1* 4/2006 Hwang ............. G02F 1/133305
                                                       438/30
2010/0038023 A1   2/2010 Kho et al.

FOREIGN PATENT DOCUMENTS

KR          10-0831562 B1    5/2008
KR     10-2017-0097562 A     8/2017

* cited by examiner

*Primary Examiner* — Sing P Chan
(74) *Attorney, Agent, or Firm* — Li & Cai Intellectual Property (USA) Office

(57) ABSTRACT

The instant disclosure provides a polyimide composite film for a flexible display and a method for manufacturing the same. The composite film can be attached to a supporting carrier and includes a double-sided tape, a releasing layer and a transparent polyimide film. The double-sided tape includes a substrate, a surface of the substrate has an adhesive disposed thereon, and the other surface of the substrate has a releasing agent disposed thereon. A releasing layer is attached to the adhesive on the substrate and is removable from the substrate so that the substrate is attachable to the supporting carrier through the adhesive. The method includes providing a transparent polyimide film; providing the double-sided tape mentioned above; and removing the releasing layer on the releasing agent of the substrate for adhering the transparent polyimide film to the releasing agent.

7 Claims, 2 Drawing Sheets

TRANSPARENT POLYIMIDE COMPOSITE FILM FOR FLEXIBLE DISPLAY AND METHOD FOR MANUFACTURING THE SAME

BACKGROUND

1. Technical Field

The instant disclosure relates to a transparent polyimide composite film for a flexible display and a method for manufacturing the same, and in particular, to an innovative composite film for a flexible display having reduced manufacturing cost and increased production efficiency.

2. Description of Related Art

Flat displays in the existing art generally employ glass substrates that are thick and fragile. However, since display products nowadays have become thin and flexible, the glass substrates are replaced by plastic flexible substrates. The manufacturing method relating to the plastic flexible substrates includes the steps of: providing a supporting carrier, forming a liquid releasing layer on the supporting carrier, baking/curing the liquid releasing layer; coating a plastic material slurry on the substrate carrier; baking/curing the plastic material slurry for forming the flexible substrate; forming integrated circuits or electrical circuits on the flexible substrate; and performing a lift-off process towards the flexible substrate and the supporting carrier for separating the flexible substrate from the supporting carrier, thereby obtaining the plastic flexible display.

In the existing art, in order to separate the flexible substrate from the supporting carrier, a laser lift-off process is performed. However, due to the thermal effect resulting from the laser lift-off process, the flexible substrate and the integrated circuit thereon may expand and be damaged. Moreover, the cost of the laser equipment is high, thereby increasing the manufacturing cost.

In addition, since the releasing layer is formed on the supporting carrier before the formation of the flexible substrate, the manufacturing method is relatively complicated and the manufacturing cost is relatively high.

SUMMARY

An embodiment of the instant disclosure provides a polyimide composite film for flexible display. The composite film can be attached to a supporting carrier and includes a double-sided tape, a releasing layer and a transparent polyimide film. The double-sided tape includes a substrate, in which a surface of the substrate has an adhesive disposed thereon and the other surface of the substrate has a releasing agent disposed thereon. The releasing layer is attached to the adhesive and is removable from the substrate so that the substrate is attachable to the supporting carrier through the adhesive. The transparent polyimide film adheres to the releasing agent on the substrate.

Another embodiment of the instant disclosure provides a method for manufacturing a transparent polyimide composite film for a flexible display. The method includes providing a transparent polyimide film; providing a double-sided tape including a substrate in which a surface of the substrate has an adhesive disposed thereon, the other surface of the substrate has a releasing agent disposed thereon, and a releasing layer is disposed on each of the adhesive and the releasing agent; and removing the releasing layer on the releasing agent for adhering the transparent polyimide film to the releasing agent.

During the use of the polyimide composite film for a flexible display provided by the instant disclosure, the composite film can be attached to a supporting carrier after the releasing layer is removed from the adhesive of the double-sided tape. Afterwards, the integrated circuits or electrical circuits can be formed on the transparent polyimide film. After the integrated circuits or electrical circuits are formed, the transparent polyimide film can be peeled-off from the releasing agent. Accordingly, the manufacturing process using the polyimide composite film provided by the instant disclosure is convenient and less complicated.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
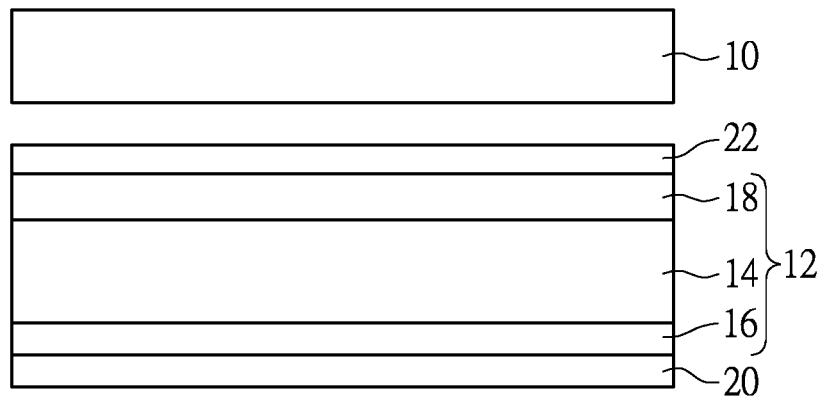
FIG. 1 is a schematic view of a transparent polyimide composite film for flexible display provided by the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Reference is made to FIG. 1. FIG. 1 is a schematic view of a transparent polyimide composite film for flexible display provided by the instant disclosure. The transparent polyimide composite film includes a transparent polyimide film 10 and a double-sided tape 12. The transparent polyimide film 10 can be manufactured by a roll-to-roll production process. The double-sided tape 12 has a substrate 14, an adhesive 16 located on a surface of the substrate 14, a releasing agent 18 located on the other surface of the substrate 14, and two releasing layers 20, 22 located on the adhesive 16 and the releasing agent 18 respectively.

Figure 2:
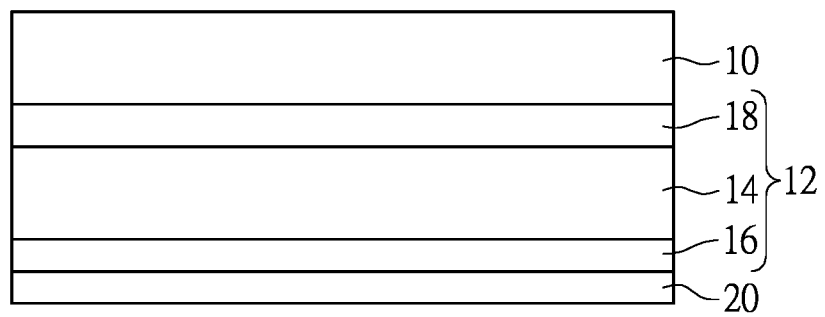
FIG. 2 is another schematic view of the transparent polyimide composite film for flexible display provided by the instant disclosure.

As shown in FIG. 2, the manufacturing process of the transparent polyimide film provided by the instant disclosure includes removing the releasing layer 22 form the releasing agent 18, and adhering the transparent polyimide film 10 to the releasing agent 18. Therefore, the manufacturing process relating to the transparent polyimide composite film is completed. The attachment between the transparent polyimide film 10 and the double-sided tap 12 can be accomplished by a roll-to-roll production process.

The releasing agent 18 can be a radiation-curable adhesive, a thermal-curable adhesive or an adhesive containing a foaming agent. The radiation-curable adhesive can have a reduced adhesion after being irradiated by UV light, thereby enabling the adhesive to be removed. The thermal-curable adhesive can have a reduced adhesion after being heated, thereby enabling the adhesive to be removed. The adhesive containing foaming agent can include foaming microspheres which expand or foam after being heated, thereby rendering the surface of the adhesive textured, and hence, the adhesive has a reduced adhesion or no adhesion.

The thermal-curable adhesive complies with the following equation: $V=[(V0-V1)/V0]\times100$, in which V is the rate of change of adhesion of the thermal-curable adhesive, V0 is the adhesion of the thermal-curable adhesive under room temperature, and V1 is the adhesion of the thermal-curable adhesive after being heated to a predetermined temperature then cooled to the room temperature. The thermal-curable adhesive includes a base polymer, at least a thermal-curable group and a thermal curing agent, the base polymer including at least a structural unit derived from a monomer, the monomer being an acryloyl group having polymerizable carbon-carbon double bond or a methacryloyl group having polymerizable carbon-carbon double bond.

The foaming microsphere in the foaming adhesive can include materials that can be easily evaporated and expanded after being heated. The materials are enclosed in an elastic shell such as microspherese of isobutane, propane or pentane. The elastic shell are generally made of thermoplastic materials, thermofusible materials or materials that break after being heated and expanded such as polyvinyl alcohol or polyvinyl butyral.

Figure 3:
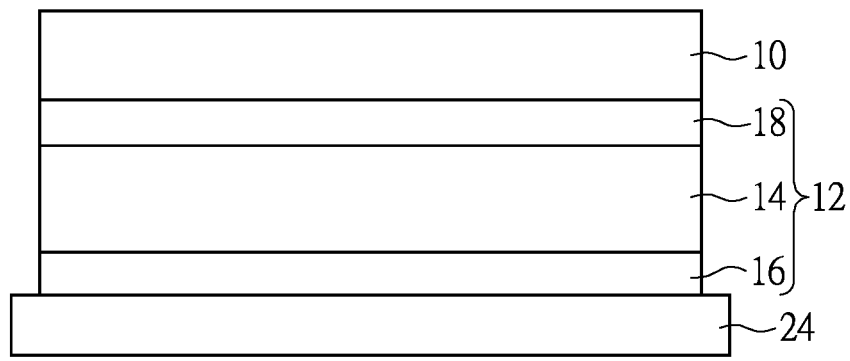
FIG. 3 is a first schematic view of the state of use of the transparent polyimide composite film provided by the instant disclosure.
Figure 4:
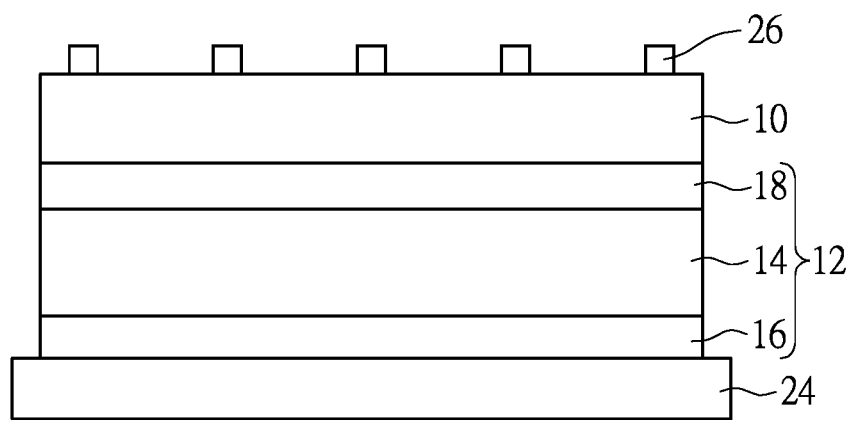
FIG. 4 is a second schematic view of the state of use of the transparent polyimide composite film provided by the instant disclosure.

Reference is made to FIG. 3 and FIG. 4. During the use of the transparent polyimide composite film of the instant disclosure in a production process of a flexible display, the releasing layer 20 is removed from the adhesive 16, and the adhesive 16 is adhered to a supporting carrier 24 such as a glass carrier. Afterwards, the process of manufacturing the flexible display is carried out on the transparent polyimide film 10. For example, integrated circuits or various electrical circuits 26 can be formed. The steps of forming such circuits are common knowledge in the art and are not described in detail herein.

Figure 5:
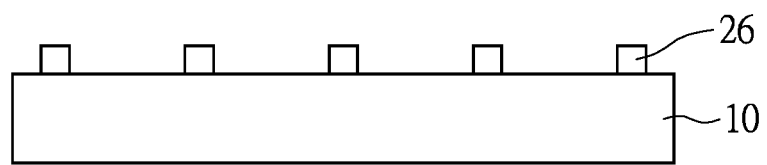
FIG. 5 is a schematic view showing the use of the transparent polyimide composite film as a flexible display.

Referring to FIG. 5, after the manufacturing processes carried out on the transparent polyimide film 10 are completed and the transparent polyimide film 10 needs to be removed from the carrier substrate 24, the following steps can be performed. If the releasing agent 18 is a radiation-curable adhesive, the releasing agent 18 can be irradiated by UV light and have reduced adhesion. Therefore, the transparent polyimide film 10 can be separated from the releasing agent 18. If the releasing agent 18 is a thermal-curable adhesive, since the manufacturing process of the flexible display includes a high temperature process, the releasing agent 18 will be cured and have a reduced adhesion after being subjected to the manufacturing process. Therefore, the transparent polyimide film 10 and the releasing agent 18 can be easily separated from each other. If the releasing agent 18 is an adhesive containing a foaming agent, the releasing agent 18 will have a reduced adhesion after being subjected to the manufacturing process. Therefore, the transparent polyimide film 10 and the releasing agent 18 can be easily separated from each other.

In addition, the adhesive 16 of the instant disclosure can also be the same as the releasing agent 18. After the manufacturing process of the transparent polyimide film display is completed and the transparent polyimide film 10 is removed from the releasing agent 18, the adhesive can be removed from the supporting carrier 24 by the same process as described for the transparent polyimide film. Therefore, the supporting carrier 24 can be reused.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A transparent polyimide composite film for a flexible display, the transparent polyimide composite being attached to a supporting carrier and comprising:
    a double-sided tape including a substrate, a surface of the substrate having an adhesive disposed thereon, and the other surface of the substrate having a releasing agent disposed thereon;
    a releasing layer attached to the adhesive on the substrate, the releasing layer being removable from the substrate so that the substrate is attachable to the supporting carrier by the adhesive; and
    a transparent polyimide film adhered to the releasing agent on the substrate;
    wherein the releasing agent is a thermal-curable adhesive, and the thermal-curable adhesive complies with the following formula: $V=[(V0-V1)/V0]\times100$, wherein V is a rate of change of adhesion of the thermal-curable adhesive, V0 is an adhesion of the thermal-curable adhesive under room temperature, and V1 is an adhesion of the thermal-curable adhesive after being heated to a predetermined temperature then cooled to the room temperature.

2. The transparent polyimide composite film according to claim 1, wherein the supporting carrier is a glass material.

3. The transparent polyimide composite film according to claim 1, wherein the thermal-curable adhesive includes a base polymer, at least a thermal-curable group and a thermal curing agent, the base polymer including at least a structural unit derived from a monomer, the monomer being an acryloyl group having polymerizable carbon-carbon double bond or a methacryloyl group having polymerizable carbon-carbon double bond.

4. The transparent polyimide composite film according to claim 1, wherein the adhesive can be a releasing agent.

5. A method for manufacturing a transparent polyimide composite film for a flexible display, including:
    providing a transparent polyimide film;
    providing a double-sided tape including a substrate, a surface of the substrate having an adhesive disposed thereon, the other surface of the substrate having a releasing agent disposed thereon, with a releasing layer being disposed on each of the adhesive and the releasing agent; and
    removing the releasing layer from the releasing agent on the substrate for attaching the transparent polyimide film on the releasing agent;
    wherein the releasing agent is a thermal-curable adhesive, and the thermal-curable adhesive complies with the following formula: $V=[(V0-V1)/V0]\times 100$, wherein V is a rate of change of adhesion of the thermal-curable adhesive, V0 is an adhesion of the thermal-curable adhesive under room temperature, and V1 is an adhesion of the thermal-curable adhesive after being heated to a predetermined temperature then cooled to the room temperature.

6. The method according to claim 5, wherein the thermal-curable adhesive includes a base polymer, at least a thermal-curable group and a thermal curing agent, the base polymer including at least a structural unit derived from a monomer, the monomer being an acryloyl group having polymerizable carbon-carbon double bond or a methacryloyl group having polymerizable carbon-carbon double bond.

7. The method according to claim 6, wherein the adhesive is a releasing agent.

* * * * *